United States Patent
Noguchi

(10) Patent No.: US 7,158,602 B2
(45) Date of Patent: Jan. 2, 2007

(54) PHASE LOCKED LOOP CIRCUIT AND CLOCK REPRODUCTION CIRCUIT

(75) Inventor: Hidemi Noguchi, Tokyo (JP)

(73) Assignee: NEC Corporation, Tokyo (JP)

( * ) Notice: Subject to any disclaimer, the term of this patent is extended or adjusted under 35 U.S.C. 154(b) by 812 days.

(21) Appl. No.: 10/300,745

(22) Filed: Nov. 21, 2002

(65) Prior Publication Data

US 2003/0103591 A1    Jun. 5, 2003

(30) Foreign Application Priority Data

Nov. 30, 2001    (JP)    ............................. 2001-365489

(51) Int. Cl.
*H03D 3/24* (2006.01)

(52) U.S. Cl. ...................... 375/376; 375/373; 375/375; 327/156; 327/147

(58) Field of Classification Search ................ 375/373, 375/374, 375, 376; 327/156, 147; 331/11, 331/14

See application file for complete search history.

(56) References Cited

U.S. PATENT DOCUMENTS

| | | | |
|---|---|---|---|
| 4,580,107 A | 4/1986 | Caldwell et al. | |
| 5,012,494 A | 4/1991 | Lai et al. | |
| 5,142,246 A * | 8/1992 | Petersson | 331/11 |
| 5,836,000 A * | 11/1998 | Choi | 331/14 |
| 6,147,530 A * | 11/2000 | Nogawa | 327/156 |
| 6,271,731 B1 * | 8/2001 | Koszarsky | 331/36 C |
| 6,353,647 B1 * | 3/2002 | Wilhelmsson et al. | 375/376 |
| 6,643,346 B1 * | 11/2003 | Pedrotti et al. | 375/375 |

* cited by examiner

*Primary Examiner*—Phuong Phu
(74) *Attorney, Agent, or Firm*—Young & Thompson

(57) ABSTRACT

A phase locked loop circuit and a clock reproduction circuit can operate stably with satisfying both of wide lock range and good jitter characteristics. The phase locked loop circuit for generating a clock signal in synchronized in phase with an input signal, has a phase comparator having an analog characteristics as a phase difference detection output characteristics and detecting a phase difference between the input signal and the clock signal, a first control loop controlled oscillation depending upon the phase difference detection output and a second control loop controlled oscillation depending upon a signal derived from the phase difference detection output with enhancing frequency components near a direct current component and performs low speed control in comparison with the first control loop.

17 Claims, 6 Drawing Sheets

PHASE LOCKED LOOP CIRCUIT AND CLOCK REPRODUCTION CIRCUIT

BACKGROUND OF THE INVENTION

1. Field of the Invention

The present invention relates to a phase locked loop (PLL) circuit and a clock reproduction circuit. More particularly, the invention relates to a PLL circuit generating a clock signal synchronized with an input signal in phase and a clock reproduction circuit using the same.

2. Description of the Related Art

In order to accurately reproduce a received data in a reception device in a communication system, it becomes necessary to extract a clock component synchronized with the received data. For extraction of the clock component and reproduction data, PLL circuits have been used widely.

In SONET (Synchronous Optical Network) system as one of communication systems, a CDR (Clock and Data Recovery) circuit using the PLL circuit has been employed in order to reproduce a clock and a data. In order to adapt to a jitter specification (standard) in the SONET system, a frequency of a VCO (Voltage-controlled oscillator) of the PLL circuit as a clock extraction circuit of the CDR circuit has to accurately match with a received data speed.

Now, consideration is given for the case where the CDR circuit is used in an optical transmission system of 10 Gbps band. While the most typical transmission speed of the SONET system is 9.95 Gbps, data speed from 10.6 Gbps to 10.8 Gbps is present in a WDM (Wavelength Division Multiplexing) optical transmission system having FEC (Forward Error Correction), and so forth depending upon FEC algorithm. For this reason, the PLL circuit for clock reproduction used in the CDR circuit is required to have a wide lock range from 9.9 Gbps not applied FEC to 10.8 Gbps applied FEC, namely the lock range corresponding to about 1 GHz. In order to realize the PLL circuit having such wide lock range, the VCO forming the PLL circuit is required to have a wide variable frequency range.

Here, even in the foregoing optical transmission system, down-sizing and reduction of power consumption of the optical transmitting and receiving device are required. For this purpose, an operation power source voltage tends to be lowered. As a result, an operation voltage of the PLL circuit also becomes low voltage in the extent of about 3V. In such low voltage, a dynamic range of the circuit naturally becomes small. Associating therewith, it is inherent to lower a control voltage of the VCO.

In this circumstance, in order to enable the VCO to realize the wide variable frequency range set forth above, the VCO having high gain (high sensitivity) becomes necessary. For example, in case of the optical transmitting and receiving device in the optical transmission system set forth above, the gain (sensitivity) of the VCO required has to have quite high gain as high as 1 GHz/V. However, when high gain as high as 1 GHz/V is provided as the gain for the VCO, it can quite sensitively follow to external or internal noise in steady operation state to cause increasing of jitter to make the system unstable. As a result, difficulty is encountered in satisfying jitter specification of the SONET system set forth above.

Namely, while it becomes necessary to set the gain of the VCO high for realizing wide variable frequency range in a limited control voltage range, sensitivity to a high range noise component from a phase comparator or a noise generated in an internal circuit which cannot be blocked by a loop filter in the PLL circuit, becomes high to increase jitter. As a result, obtaining wide lock range and improvement of jitter characteristics is a relationship of so-called trade-off. Therefore it has been demanded to achieve both of obtaining wide lock range and improvement of jitter characteristics.

Here, reference is made to U.S. Pat. No. 5,012,494, there has been disclosed a PLL circuit having two control loops using the VCO having two inputs (two control input terminals). FIG. 9 shows a block diagram of the PLL circuit disclosed in the above-identified U.S. Pat. No. 5,012,494. In FIG. 9, an input data and a clock signal by a VCO 12 are input to a digital type frequency phase comparator (FD/PD) 11 for detecting a phase difference. A phase difference detection output S11 is supplied to one of two inputs of the VCO 12, and in conjunction therewith, is an input of an integrator (INTEG) 13. An integrator output S12 is supplied to the other of two inputs of the VCO 12.

Namely, by the output S11 of the frequency phase comparator 11, fine adjustment (phase: offset factor) of the VCO is controlled, and by integrated output S12 resulting from integration of the output S11 by an integrator 13, rough adjustment (frequency: centering factor) of the VCO 12 is controlled to form a dual-loop structure.

The frequency phase comparator 11 of FIG. 9 has a digital circuit construction having a frequency difference detection characteristics of the input data and the reproduction clock by the VCO as digital characteristics shown in FIG. 10B. Namely, the detection output (PD output) becomes a binary data which becomes high level when a phase difference is in a range between 0 to π, and becomes low level when the phase difference falls in a range between −π to 0.

Here, referring to FIG. 10A, a characteristic chart shows the case of a phase comparator which has a phase comparison characteristics of analog characteristics. In a phase difference in a range of −π to π, the phase comparison characteristics becomes linear with a constant gradient to be the characteristics of the analog phase comparator. A gain of such analog phase comparator has a linear gradient as shown in FIG. 10A. The gradient is always constant irrespective of amplitude of the jitter of the input signal. However, in case of the digital phase comparator shown in FIG. 10B, since the gradient of the characteristics is infinite, the gain is theoretically infinite. However, in practice, a shown in one-dotted line, the characteristics of the digital phase comparator has finite gradient and the gradient is variable depending upon amplitude of jitter of the input signal.

Accordingly, the gain of the frequency phase comparator 11 in the conventional PLL circuit shown in FIG. 9 inherently fluctuates. As a result, an open loop gain of the circuit shown in FIG. 9 inherently fluctuates. This means that the transmission characteristics of the closed loop of the PLL circuit can fluctuate to make the PLL circuit per se unstable to cause difficulty in satisfying the jitter specification (standard) in the SONET system.

On the other hand, since a complete integrator is employed in the integrator 13 in the circuit of FIG. 9, if DC offset voltage is present in the circuit, such offset voltage is integrated by the complete integrator to finally lead out an integrator output voltage maintained at an upper limit or a lower limit of the dynamic range of the circuit to make it impossible to obtain operation of the PLL circuit.

SUMMARY OF THE INVENTION

It is an object of the present invention is to provide a PLL circuit and a clock reproduction circuit which can operate stably with satisfying both of wide lock range and good jitter characteristics.

In order to accomplish the above-mentioned object, according to the first aspect of the present invention, a phase locked loop circuit for generating a clock signal in synchronized in phase with an input signal, comprises:

a phase comparator having an analog characteristics as a phase difference detection output characteristics and detecting a phase difference between the input signal and the clock signal;

a first control loop controlled oscillation depending upon the phase difference detection output; and a second control loop controlled oscillation depending upon a signal derived from the phase difference detection output with enhancing frequency components near a direct current component and performs low speed control in comparison with the first control loop.

The first control loop may include a loop filter taking the phase difference detection output as an input and a two control input type voltage controlled oscillator generating the clock signal, and a first control input terminal of the voltage controlled oscillator is supplied an output of the loop filter.

The second control loop may have a direct current gain enhancer enhancing the frequency components near the direct current component of the phase difference detection output, and an output the direct current gain enhancer may be supplied to a second control terminal of the voltage controlled oscillator.

According to the second aspect of the present invention a phase locked loop circuit for generating a clock signal in synchronized in phase with an input signal, comprises:

a phase comparator having an analog characteristics as a phase difference detection output characteristics and detecting a phase difference between the input signal and the clock signal;

a direct current gain enhancer increasing a gain of frequency components near a direct current component of a phase difference detection output; and a two control input type voltage controlled oscillator supplied the phase difference detection output and an output of the direct current gain enhancer to first and second control terminals respectively.

The phase locked loop circuit may further comprise a loop filter taking the phase difference detection output, and a loop filter output is supplied to the first control terminal. The direct current gain amplifier may be an incomplete integration circuit.

The two control terminal type voltage controlled oscillator may be set a control sensitivity of the first control terminal to be lower than a control sensitivity of the second control terminal.

The phase locked loop circuit may further comprise a frequency difference detector for detecting a frequency difference between the input signal and the clock signal, and an adder for adding a frequency difference detection output to an input of the direct current gain amplifier.

A clock reproduction circuit extracting and reproducing a clock signal component from an input signal including a phase locked loop circuit set forth above.

In the operation of the phase locked loop circuit according to the present invention, an analog phase comparator having analog characteristics is employed as the phase detector to stabilize the gain of the phase comparator per se and thus to stabilize transmission characteristics of the overall PLL circuit. On the other hand, the dual input VCO (dual-input voltage controlled crystal oscillator) having the high gain frequency rough adjustment (low speed) control terminal and the low gain frequency fine adjustment (high speed) control terminal is employed as the VCO. The output of the phase comparator is connected to the frequency fine adjustment (high speed) control terminal of VCO, and is input to the frequency rough adjustment (low speed) control terminal of VCO via the narrow band direct current gain amplifier (DCGE: DC gain enhancer).

With this construction, in order to obtain the wide lock range, one of the control terminals of the dual-input VCO is provided high gain (increase the gain of VCO). By employing the narrow band direct current gain enhancer, high frequency noise component generated by the phase comparator can be sufficiently eliminated so as not to cause deterioration of jitter characteristics. Therefore, VCO gain of the low speed control loop via the direct current gain enhancer can set at higher gain than the VCO gain of the wide band high speed control loop via the loop file to permit widen variable range of the VCO without sacrificing the jitter characteristics. As a result, lock range can be widened.

BRIEF DESCRIPTION OF THE DRAWINGS

The present invention will be understood more fully from the detailed description given hereinafter and from the accompanying drawings of the preferred embodiment of the present invention, which, however, should not be taken to be limitative to the invention, but are for explanation and understanding only.

In the drawings.

DESCRIPTION OF THE PREFERRED EMBODIMENT

The present invention will be discussed hereinafter in detail in terms of the preferred embodiment of a phase locked loop (PLL) circuit and a clock reproduction circuit in accordance with the present invention with reference to the accompanying drawings. In the following description, numerous specific details are set forth in order to provide a thorough understanding of the present invention. It will be obvious, however, to those skilled in the art that the present invention may be practiced without these specific details.

Figure 1:
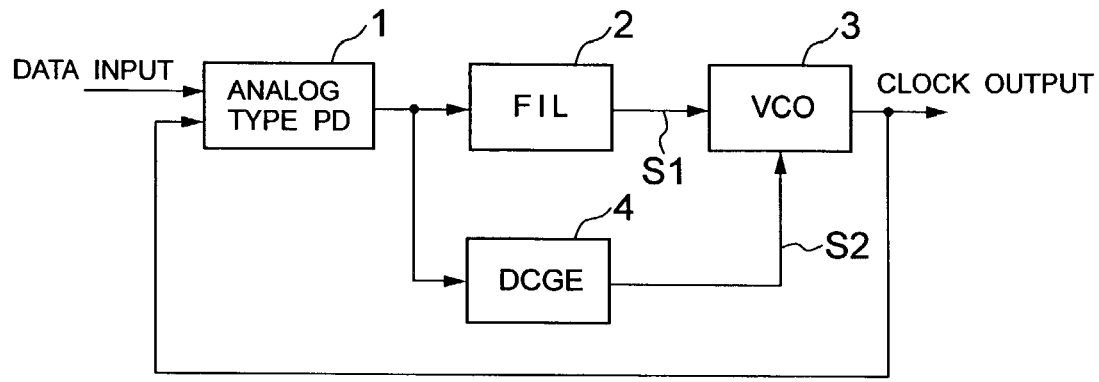
FIG. 1 is a schematic block diagram showing a construction of one embodiment of the present invention.
Figure 10A:
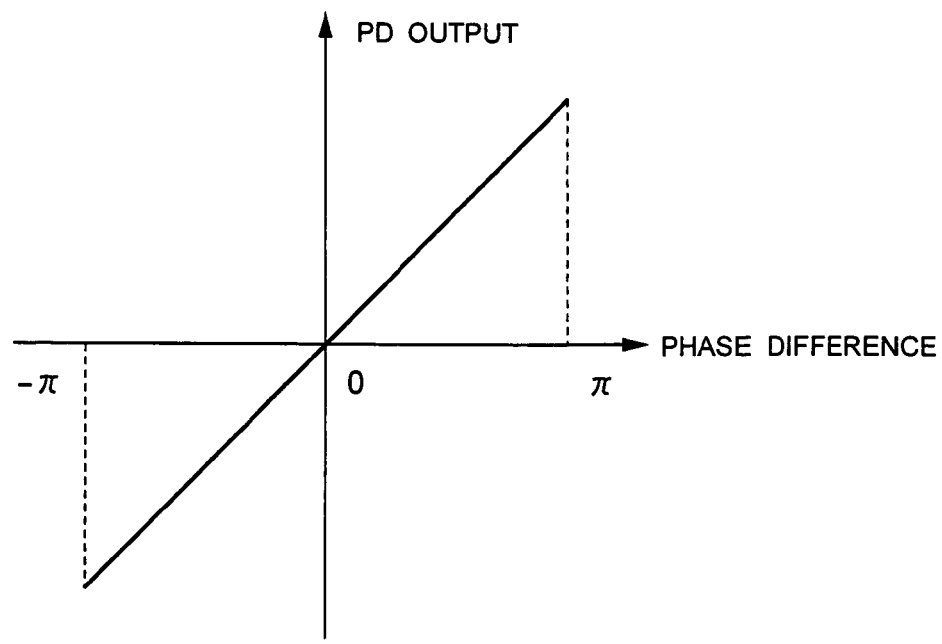
FIG. 10A is an illustration showing an analog type characteristics of a phase comparator.
Figure 10B:
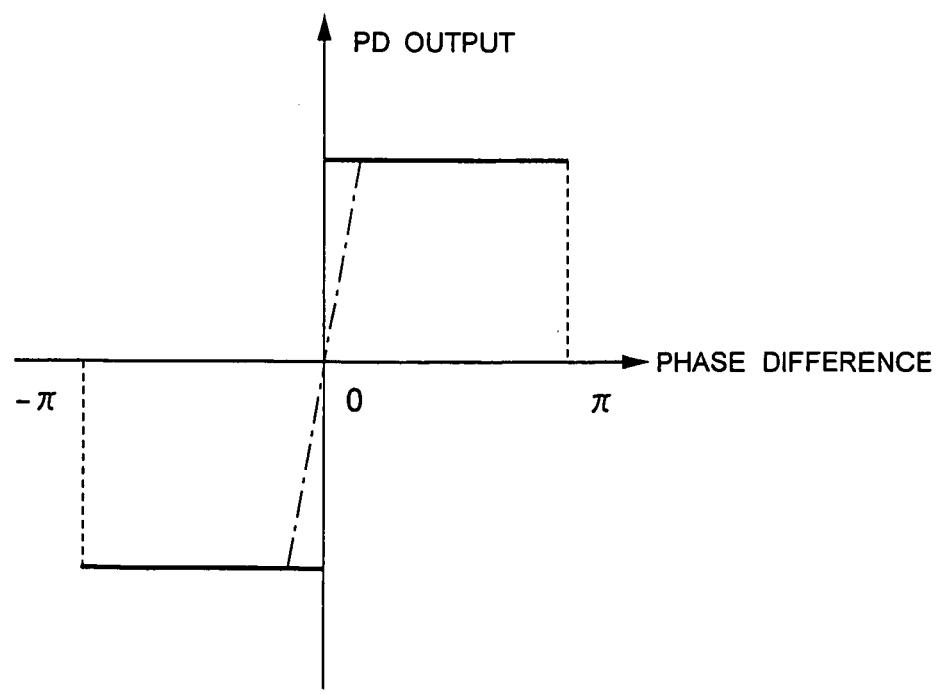
FIG. 10B is an illustration showing a digital type characteristics of the phase comparator.

FIG. 1 is a block diagram showing a construction of one embodiment of the present invention. In FIG. 1, a phase comparator (PD) 1 takes an input data and an output signal (also serving as clock output) of a VCO 3 as two inputs to detect a phase difference between these two input signals. As the phase comparator 1, an analog type phase comparator is used. The analog type phase comparator has a phase difference detection output characteristics linear in a range where the phase difference is −π to π as shown in FIG. 10A. A gradient of a straight line expressing the phase difference detection output characteristics is a gain of the phase comparator.

Since the gain of the phase comparator having such linear characteristics is constant, stable gain of the open loop can be obtained. As a result, a transmission characteristics of closed loop becomes stable to avoid variation of the gain relative to variation of amplitude of jitter of the input signal. It should be noted that as an example of such analog type phase comparator, one disclosed in U.S. Pat. No. 4,535,459 may be employed. However, various other known circuit construction may also be employed.

A phase difference output of the phase comparator 1 is input to a loop filter (FIL) 2, in which a control voltage of the VCO 3 is generated. As the loop filter 2, a low-pass type filter or a lag-lead filter may be used. The VCO 3 is a dual-input VCO having two control terminals including a low gain high speed control terminal (S1) and a high gain low speed control terminal (S2).

A direct current gain enhancer (DCGE) 4 is a direct current amplifier amplifying a frequency region sufficiently lower than a frequency band of the loop filter 2. As one example, in the shown embodiment applied for a transmission speed of 10 Gbps, the frequency region is 1 KHz. The direct gain amplifier 4 takes an output of the phase comparator 1 as input and supplies own output to the high gain low speed control terminal (S2) of the VCO 3. An output of the VCO 3 is fed back to the input of the phase comparator 1. By the phase comparator 1, the direct current gain enhancer 4 and the VCO 3 on the side of the low speed control terminal (S2), a low speed (rough adjustment) control loop (Slow tracking loop) is constructed. On the other hand, the output of the loop filter 2 is supplied to the low gain high speed control terminal (S1). By the phase comparator 1, the loop filter 2 and the VCO 3 on the side of the high speed control terminal (S1), a high speed (fine adjustment) loop (Fast tracking loop) is constructed.

The phase comparator 1 is designed to detect the phase difference between the input data signal and the output signal of the dual-input VCO 3. As set forth above, analog type phase comparator is used in order to avoid variation of gain relative to amplitude variation of the input jitter and to obtain stable transmission characteristics. The output of the phase comparator is branched into two so that one of the branched output is connected to the low gain high speed control terminal (S1) of the dual-input VCO 3.

The other of the branched outputs of the phase comparator 1 is input to the direct current gain enhancer 4. The direct current gain enhancer 4 is the direct current amplifier having a narrow band characteristics amplifying the frequency region sufficiently lower than the band of the loop filter 2, which frequency region will be referred to hereinafter as low frequency region. By this, a high frequency noise generated in the phase comparator 1 can be eliminated, and in conjunction therewith, an open gain of the low frequency band is elevated for serving to suppress noise in a PLL loop or a low band jitter component generated by the VCO. On the other hand, since the direct current gain of open loop is increased. It is effective for restricting a steady phase difference (Static phase error).

For example, as discussed in the section of prior art, in case of an optical transmission system requiring low voltage operation and a lock range corresponding to 1 GHz, a sensitivity (gain) of VCO on the side of the high gain low speed control terminal (S2) is set at 1 GHz/V and a sensitivity (gain) of the VCO on the side of the low gain high speed control terminal (S1) is set at 100 MHz/V which is one tenth of 1 GHz/V in order to certainly obtain wide lock range in the limited dynamic range. Thus, a frequency difference component is controlled for rough adjustment having low speed and high gain to certainly provide wide lock range. On the other hand, a fine component of the phase difference (including noise) is controlled by the fine adjustment loop having high speed and low gain to attain good jitter characteristics. Accordingly, the control loop including the loop filter 2 is referred to as low gain high speed control loop.

In order to reproduce the clock, VCO 3 is used. In this case, for suppressing an output jitter due to fluctuation of the pattern of the input data signal, it becomes necessary to accurately match the received data speed with the center frequency of the VCO 3. Accordingly, the input voltage to be applied to the frequency control terminal determining the center frequency of the VCO 3, namely to the low speed control terminal (S1), has to be maintained constant. Since the direct current gain enhancer 4 has sufficiently low time constant relative to fluctuation of the pattern of the input data signal, namely narrow band characteristics, it can absorb a long term frequency fluctuation of the received data speed which fluctuates depending upon the pattern of the input data signal to suppress jitter by restricting fluctuiation of the input voltage to the low speed control terminal (S1) of the dual-input VCO 3 depending upon the input pattern. Accordingly, the control loop including the direct current gain enhancer 4 is referred to as high gain low speed control loop.

Figure 2:
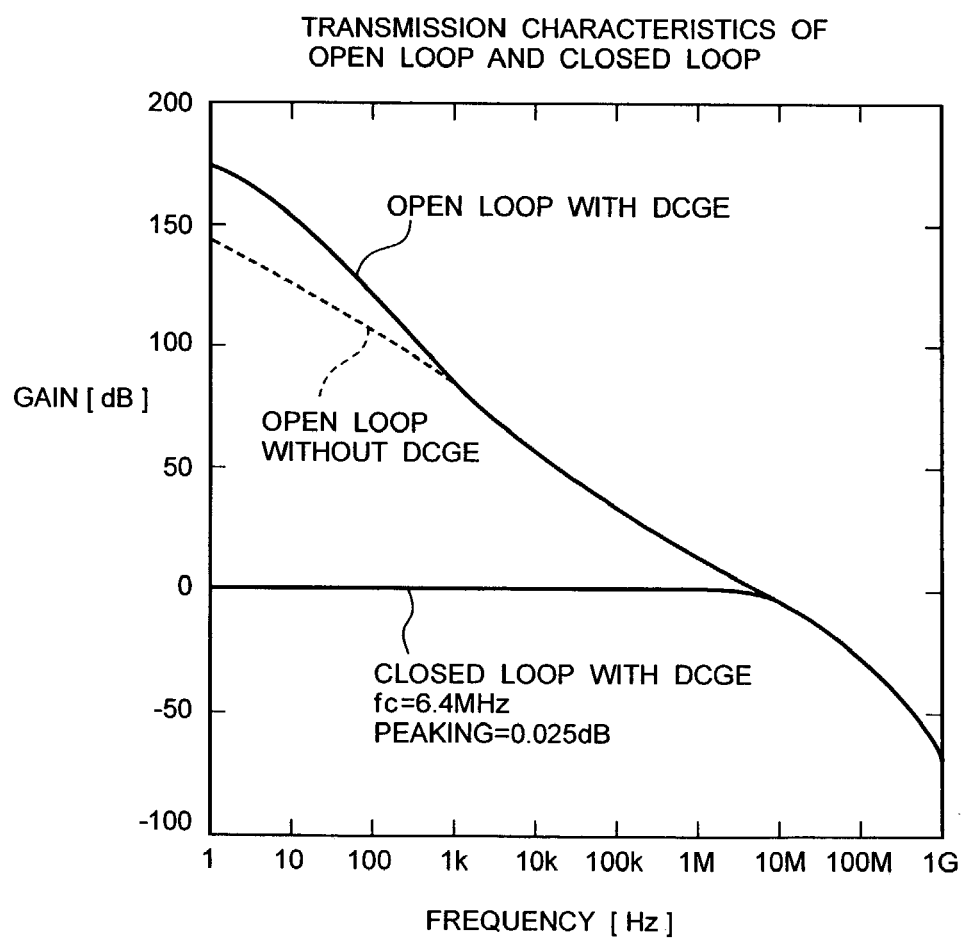
FIG. 2 is an illustration showing a transmission characteristics in an open loop and a closed loop in FIG. 1.

As set forth above, the direct current gain enhancer 4 has an effect for eliminating jitter depending upon the input pattern to significantly suppress an output jitter. FIG. 2 illustrates an open loop characteristics of the typical conventional PLL loop, an open loop characteristics of the case where the low speed control loop using the direct current gain enhancer 4 is added, and a closed loop characteristics in the latter case. Referring to FIG. 2, by the effect of the direct current gain enhancer 4, the open loop gain in the extent of 32 dB is increased in the low frequency region (<1 kHz) as the component close to the direct current. As a result, it becomes possible to suppress the static phase error as small as it can be ignored. Thus, the center of an eye opening portion of the data signal can be sampled.

Figure 3:
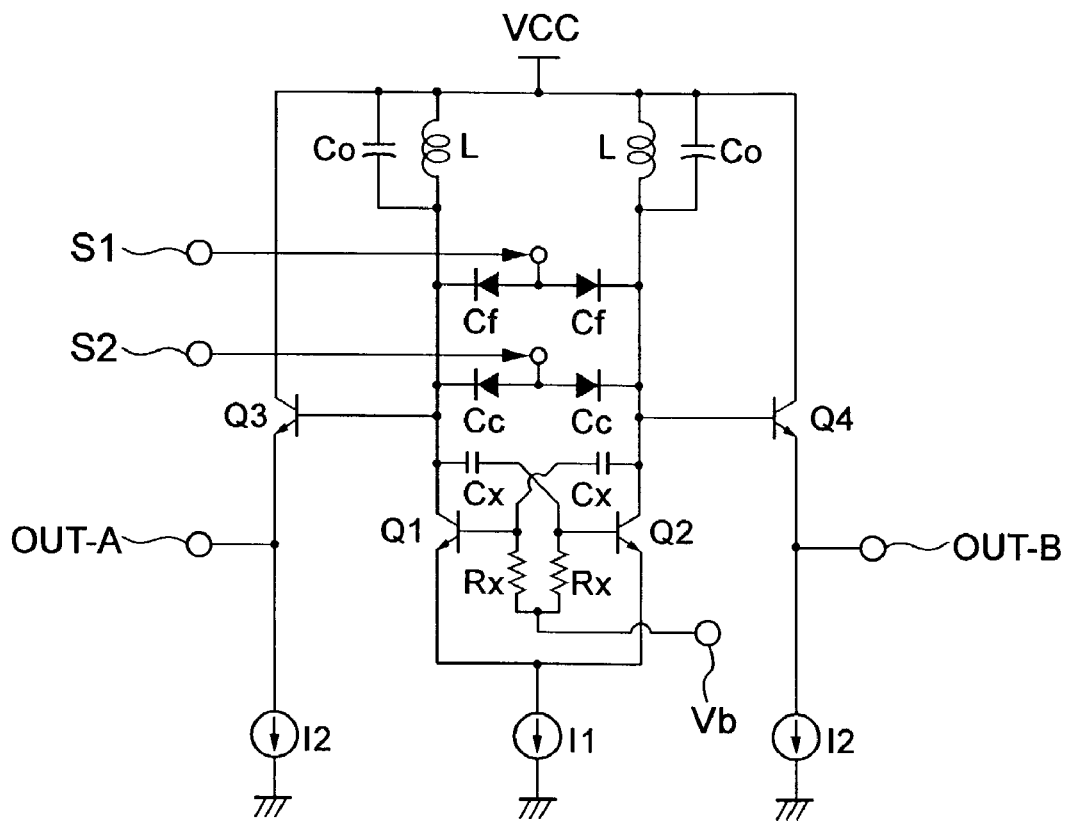
FIG. 3 is a circuit diagram showing a particular embodiment of a VCO 3 in FIG. 1.

FIG. 3 shows an example of particular circuit diagram of the VCO 3 having two frequency control input terminals. In order to minimize phase noise, an LC oscillator (L, Co) having single stage structure using a high Q inductance is used (increasing of number of stages of the oscillators can increase internal noise to make phase noise worse). An oscillation frequency of the VCO is expressed by the following equation.

$$f_{vco} = 1/2\pi \sqrt{\{L(C_c + C_f + C_o + C_s)\}}$$

wherein $C_c$ is a capacity of a variable capacitor for rough adjustment, $C_f$ is a capacity of a variable capacitor for fine adjustment, $C_o$ is a capacity of fixed capacitor and $C_s$ is a parasitic capacity.

It should be noted that, in the circuit of VCO shown in FIG. 3, $Q_3$ and $Q_4$ denote emitter follower transistors; Rx denotes a resistor for supplying a bias voltage $V_b$ of the transistors $Q_1$ and $Q_2$, $C_x$ denotes a capacitor and $I_1$ and $I_2$ denote current sources. Then, an element for oscillation is provided corresponding to the frequency control inputs (S1, S2). Thus, by appropriately selecting constants of the elements, it is clear that control sensitivity (gain) of the oscillation frequency can be freely set.

Figure 4:
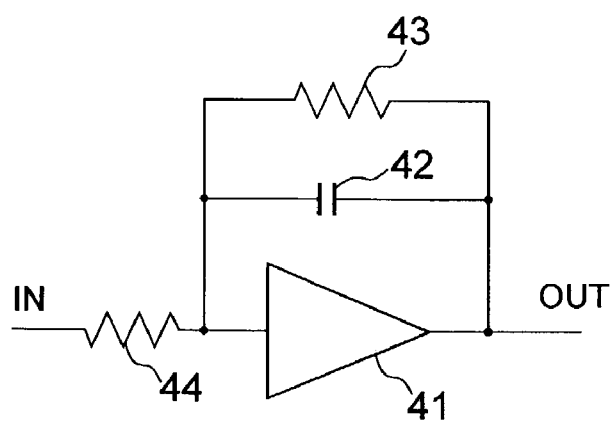
FIG. 4 is a circuit diagram showing a particular embodiment of a DCGE 4 in FIG. 1.

FIG. 4 is an illustration showing a particular example of DCGE 4 in FIG. 1. The DCGE 4 is constructed with an amplifier 41, a resistor 44 connected to the input in series, and a parallel circuit of a capacitor 42 and a resistor 43 provided between input and output of the amplifier, and this is an incomplete integrator (low pass filter). By using such incomplete integrator, even when a direct current offset is caused in the PLL circuit, the integrator output voltage will not be maintained at the upper and lower limit of the dynamic range different from the complete integrator.

As set for above, in the shown embodiment, the PLL is constructed by the dual-input VCO 3, the high speed control (fine adjustment) loop having wide band, and the low speed control (rough adjustment) loop having narrow band including the direct current gain enhancer 4. Therefore, in the shown embodiment, in comparison with the conventional CDR, the lock range is expanded more than one digit, and can suppress the output jitter smaller to increase jitter tolerance.

Figure 5:
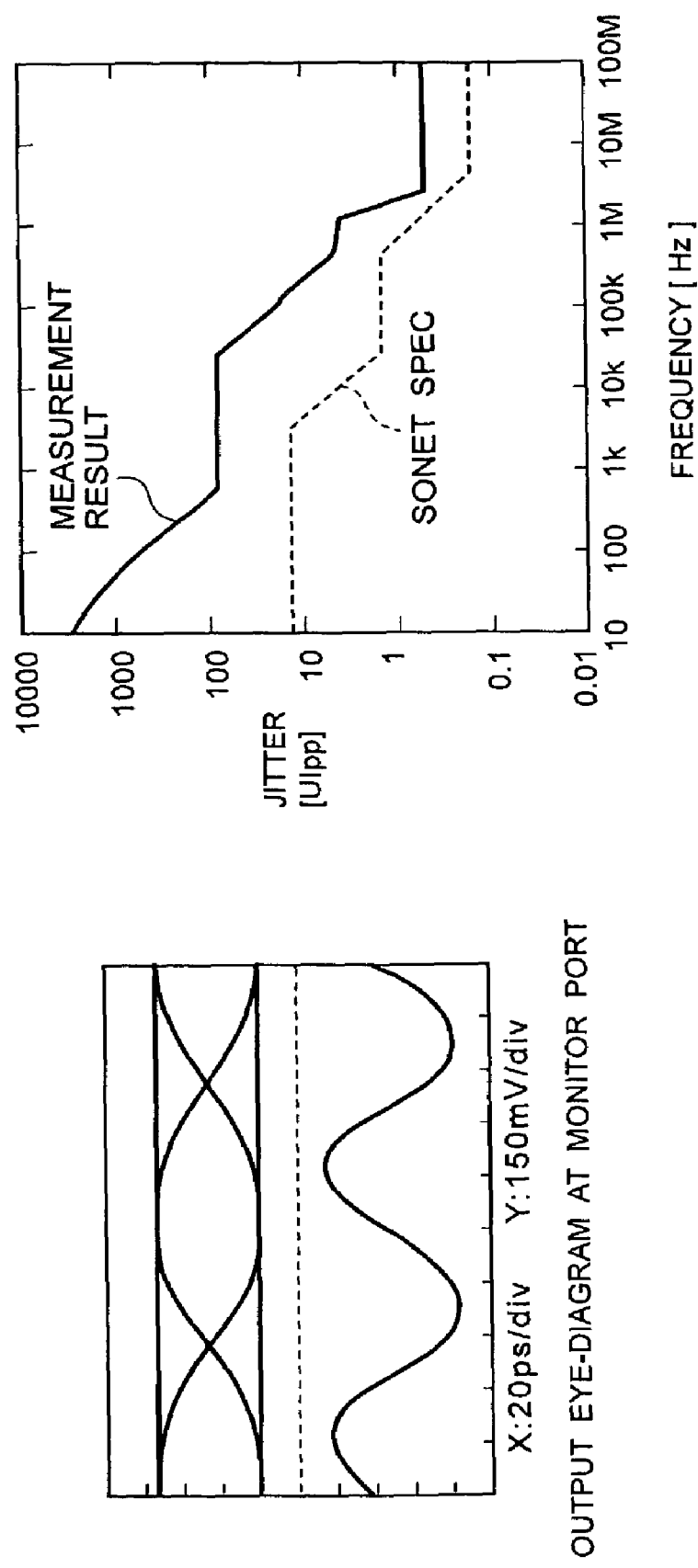
FIG. 5 is an illustration showing an output eye-diagram and a jitter tolerance.
Figure 6:
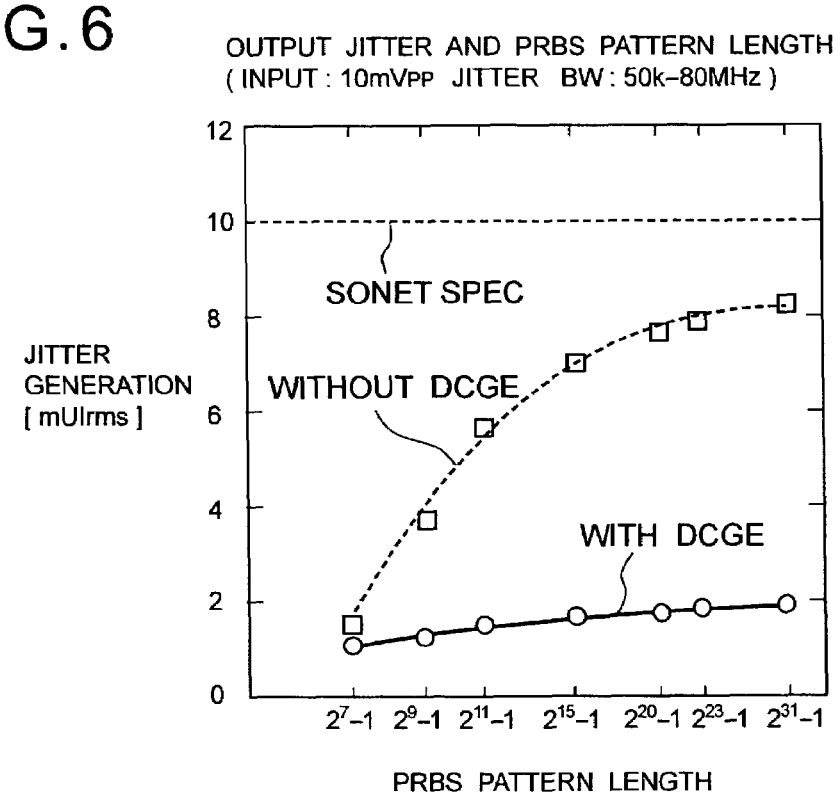
FIG. 6 is an illustration showing a relationship between an output jitter and a PRBS pattern length.

FIG. 5 is an illustration showing an output eye-diagram and a jitter tolerance. As can be seen from FIG. 5, the jitter tolerance is greater than or equal to 0.45 UI (UI: unit interval=1 bit width) in a region of 4 to 80 MHz. On the other hand, the output waveform shows quite small jitter. On the other hand, as shown in FIG. 6, an output jitter amount is 2 mUIrms with respect to PRBS (Pseudo Random Binary Sequence) ($2^{31}$–1). Comparing presence and absence of the direct current gain enhancer 4, the effect should be clear. It can be appreciated that jitter is sufficiently suppressed with respect to increasing of the pattern length.

Figure 7:
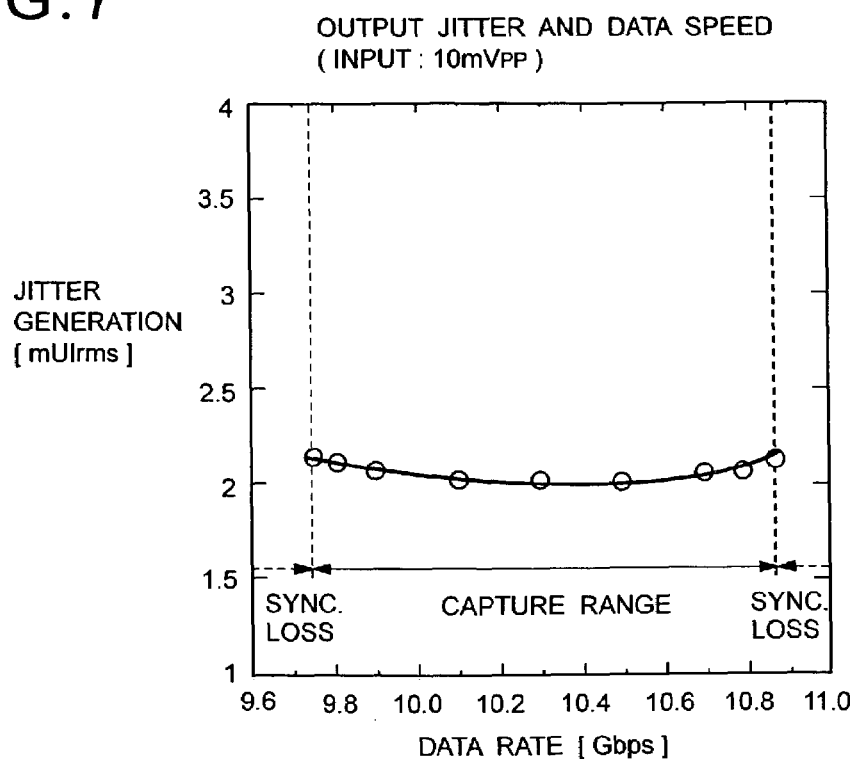
FIG. 7 is an illustration showing a relationship between an output jitter and a data speed.

FIG. 7 shows a relationship between the output jitter and the data speed. From FIG. 7, it can be appreciated that the output jitter amount can be constant over a wide region as wide as 9.9 Gbps to 10.8 Gbps.

Figure 8:
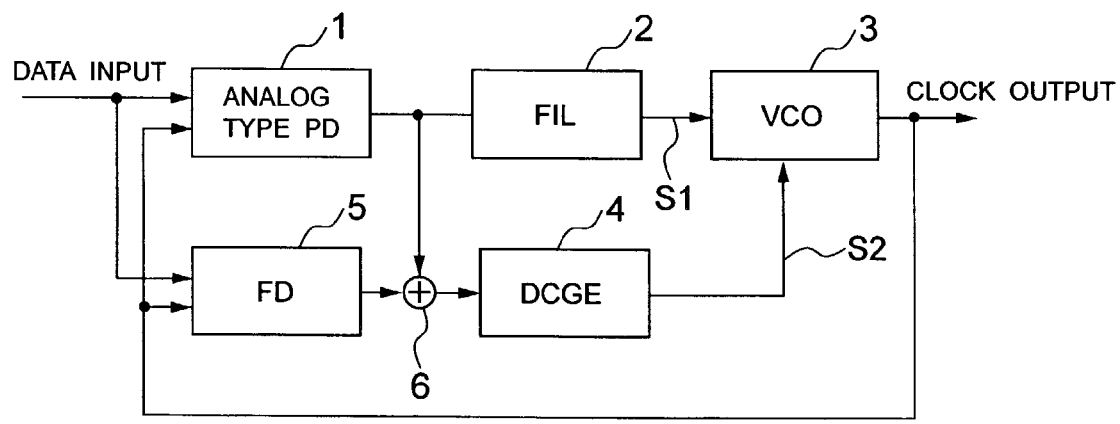
FIG. 8 is a schematic block diagram showing a construction of another embodiment of the present invention.
Figure 9:
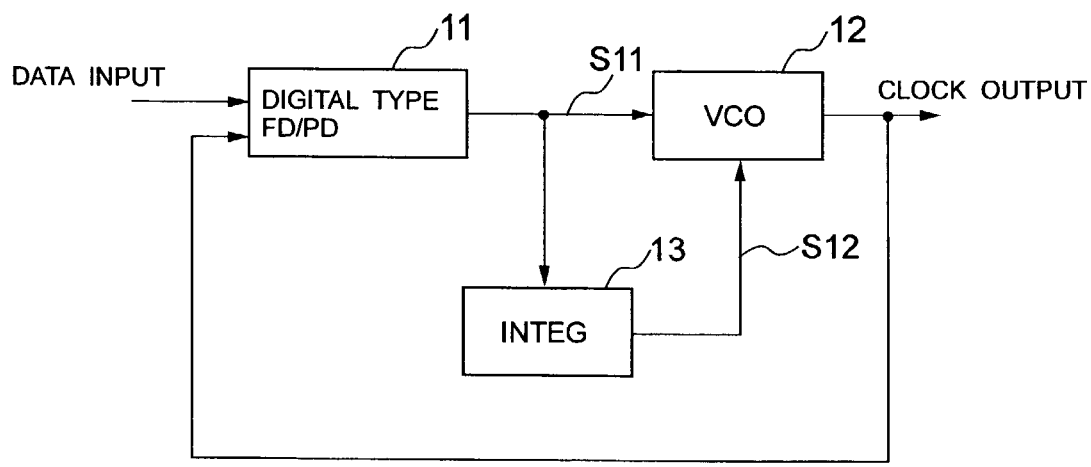
FIG. 9 is an illustration showing an example of the conventional PLL circuit.

FIG. 8 is an illustration showing another embodiment of the present invention. In FIG. 8, like components to those in the former embodiment will be identified by like reference numerals and detailed description for such common components will be eliminated for avoiding redundant description for keeping the disclosure simple enough to facilitate clear understanding of the present invention. In the shown embodiment, in addition to the construction shown in FIG. 1, a frequency comparator (FD) 5 for frequency lock is added. The frequency comparator 5 is adapted to detect a frequency difference between the input data and the output of the VCO 3, and detects a beat between the frequency of the input data and the output frequency of the VCO 3 to output a binary signal indicating high or low of the frequency of the input data relative to the output frequency of the VCO 3. The output is added to the output of the phase comparator 2 by an adder 6 and an output of the adder 6 is supplied to the low speed control terminal (S2) of the VCO 3 via the direct current gain enhancer 4. By this, PLL can be certainly locked as long as the frequency falls within a frequency range which can be oscillated by the VCO.

As set forth above, with the present invention, by employing analog type phase comparator as the phase comparator, transmission characteristics of the circuit is stabilized. Also, by employing a construction wherein the high speed control (frequency fine adjustment) loop having wide band and the low speed control (frequency rough adjustment) loop having narrow band including the direct current gain enhancer, output jitter can be more restricted with enlarging the lock range to increase jitter tolerance. Expansion of the lock range results in expansion of capture range of the PLL circuit.

Furthermore, even under limited dynamic range, trade-off between the expansion of the lock range and the jitter tolerance can be effectively solved. Thus, PLL circuit is operable in low power source. Therefore, power saving in the clock reproduction circuit or the optical transmitting and receiving device can be achieved.

Although the present invention has been illustrated and described with respect to exemplary embodiment thereof, it should be understood by those skilled in the art that the foregoing and various other changes, omission and additions may be made therein and thereto, without departing from the spirit and scope of the present invention. Therefore, the present invention should not be understood as limited to the specific embodiment set out above but to include all possible embodiments which can be embodied within a scope encompassed and equivalent thereof with respect to the feature set out in the appended claims.

What is claimed is:

1. A phase locked loop circuit for generating a clock signal synchronized in phase with an input signal, comprising:
    a phase comparator having an analog phase difference detection output that is linear with a constant gradient between +Π and –Π phase difference, said phase comparator detecting a phase difference between said input signal and said clock signal;
    a first control loop for controlling oscillation depending upon said phase difference detection output; and
    a second control loop for controlling oscillation depending upon a signal derived from the phase difference detection output with enhancing frequency components near a direct current component and for performing low speed control in comparison with said first control loop.

2. A phase locked loop circuit as set forth in claim 1, wherein said first control loop includes a loop filter taking said phase difference detection output as an input and a dual-input voltage controlled oscillator generating said clock signal, wherein a first control terminal of said dual-input voltage controlled oscillator is connected to an output of said loop filter.

3. A phase locked loop circuit as set forth in claim 2, wherein said second control loop has a direct current gain enhancer enhancing the frequency components near the direct current component of said phase difference detection output, wherein an output from said direct current gain enhancer is supplied to a second control terminal of said voltage controlled oscillator.

4. A phase locked loop circuit as set forth in claim 3, wherein said direct current gain enhancer is an incomplete integration circuit.

5. A phase locked loop circuit as set forth in claim 2, wherein said dual-input voltage controlled oscillator is set a control sensitivity of said first control terminal to be lower than a control sensitivity of said second control terminal.

6. A phase locked loop circuit as set forth in claim 3, which further comprises a frequency difference detector for detecting a frequency difference between said input signal and said clock signal, and an adder for adding a frequency difference detection output to an input of said direct current gain enhancer.

7. A phase locked loop circuit for generating a clock signal synchronized in phase with an input signal, comprising:

a phase comparator having an analog phase difference detection output that is linear with a constant gradient between $+\Pi$ and $-\Pi$ phase difference, said phase comparator detecting a phase difference between said input signal and said clock signal;

a direct current gain enhancer enhancing a gain of frequency components near a direct current component of the phase difference detection output; and a dual-input voltage controlled oscillator having first and second control terminals, wherein said phase difference detection output and an output of said direct current gain enhancer are provided to said first and second control terminals respectively.

8. A phase locked loop circuit as set forth in claim 7, which further comprises a loop filter taking said phase difference detection output as an input, and a loop filter output is supplied to said first control terminal.

9. A phase locked loop circuit as set forth in claim 7, wherein said direct current gain enhancer is an incomplete integration circuit.

10. A phase locked loop circuit as set forth in claim 7, wherein said dual-input voltage controlled oscillator is set a control sensitivity of said first control terminal to be lower than a control sensitivity of said second control terminal.

11. A phase locked loop circuit as set forth in claim 7, which further comprises a frequency difference detector for detecting a frequency difference between said input signal and said clock signal, and an adder for adding a frequency difference detection output to an input of said direct current gain enhancer.

12. A clock reproduction circuit extracting and reproducing a clock signal component from an input signal including the phase locked loop circuit set forth in claim 1.

13. A clock reproduction circuit extracting and reproducing a clock signal component from an input signal including the phase locked loop circuit set forth in claim 7.

14. A phase locked loop circuit as set forth in claim 3, wherein said dual-input voltage controlled oscillator comprises a first variable capacitor for fine frequency adjustment and a second variable capacitor for rough frequency adjustment, and wherein said first control terminal is connected to said first variable capacitor and said second control terminal is connected to said second variable capacitor, and wherein the output from said direct current gain enhancer is provided to said second variable capacitor separately from the output of said loop filter that is provided to said first variable capacitor.

15. A phase locked loop circuit as set forth in claim 7, wherein said dual-input voltage controlled oscillator comprises a first variable capacitor for fine frequency adjustment and a second variable capacitor for rough frequency adjustment, and wherein said first control terminal is connected to said first variable capacitor and said second control terminal is connected to said second variable capacitor, and wherein the output from said direct current gain enhancer is provided to said second variable capacitor separately from the output of said loop filter that is provided to said first variable capacitor.

16. A phase locked loop circuit as set forth in claim 3, wherein said direct current gain enhancer comprises an amplifier connected between an input and the output of said direct current gain enhancer, and a capacitor and a resistor that are each connected separately in parallel with said amplifier.

17. A phase locked loop circuit as set forth in claim 7, wherein said direct current gain enhancer comprises an amplifier connected between an input and the output of said direct current gain enhancer, and a capacitor and a resistor that are each connected separately in parallel with said amplifier.

* * * * *